(12) United States Patent
Patel

(10) Patent No.: US 8,878,354 B1
(45) Date of Patent: Nov. 4, 2014

(54) METHOD AND APPARATUS FOR SUPPLYING POWER TO A SYSTEM ON A CHIP (SOC)

(75) Inventor: Rakesh J. Patel, Chandler, AZ (US)

(73) Assignee: Marvell World Trade Ltd., St. Michael (BB)

(*) Notice: Subject to any disclaimer, the term of this patent is extended or adjusted under 35 U.S.C. 154(b) by 208 days.

(21) Appl. No.: 13/485,635

(22) Filed: May 31, 2012

Related U.S. Application Data

(60) Provisional application No. 61/491,682, filed on May 31, 2011.

(51) Int. Cl.
| | |
|---|---|
| H01L 23/52 | (2006.01) |
| H01L 23/02 | (2006.01) |
| H01L 23/48 | (2006.01) |
| H01L 27/146 | (2006.01) |
| H01L 25/11 | (2006.01) |
| H01L 25/065 | (2006.01) |

(52) U.S. Cl.
CPC ................................. H01L 25/0657 (2013.01)
USPC .... 257/691; 257/686; 257/777; 257/E27.137; 257/E25.027

(58) Field of Classification Search
CPC .................................................. H01L 25/0657
USPC ........... 257/691, 686, 777, E27.137, E25.027
See application file for complete search history.

(56) References Cited

U.S. PATENT DOCUMENTS

| | | | |
|---|---|---|---|
| 7,612,978 B2 | 11/2009 | Bergstrom et al. | |
| 8,338,940 B2 * | 12/2012 | Yamazaki et al. | ............ 257/693 |
| 8,508,954 B2 * | 8/2013 | Kwon et al. | ................. 361/790 |
| 8,604,597 B2 * | 12/2013 | Jiang | ............................. 257/676 |
| 2003/0143964 A1 | 7/2003 | Otsuka et al. | |
| 2009/0072930 A1 | 3/2009 | Dutta | |
| 2011/0281400 A1 | 11/2011 | Fryklund et al. | |
| 2012/0161331 A1 | 6/2012 | Gonzalez et al. | |
| 2013/0015585 A1 | 1/2013 | Kosenko et al. | |

* cited by examiner

*Primary Examiner* — Luan C Thai

(57) ABSTRACT

A semiconductor package including i) a first semiconductor die and ii) a second semiconductor die vertically stacked on top of the first semiconductor die. The first semiconductor die includes a first electronic component and a second electronic component, in which the first electronic component operates in accordance with power associated with a first power domain, and the second electronic component operates in accordance with power associated with a second power domain. The second semiconductor die is configured to supply the power associated with the first power domain to the first electronic component of the first semiconductor die, and supply the power associated with the second power domain to the second electronic component of the first semiconductor die.

16 Claims, 14 Drawing Sheets

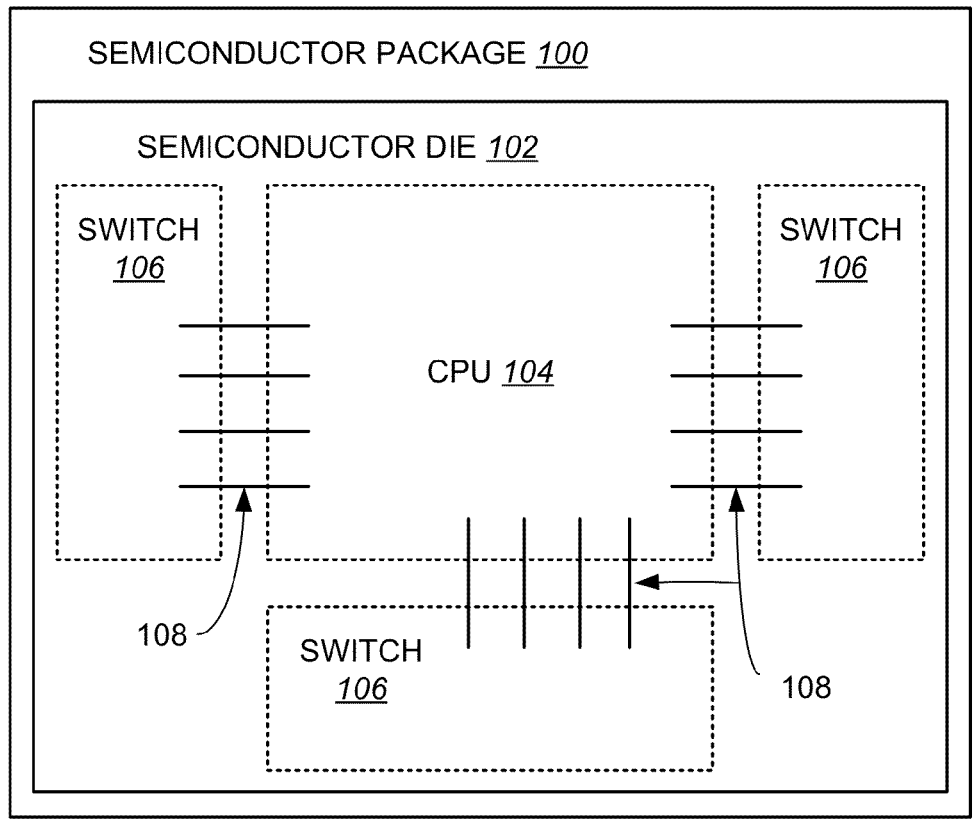
FIG. 1A *(PRIOR ART)*
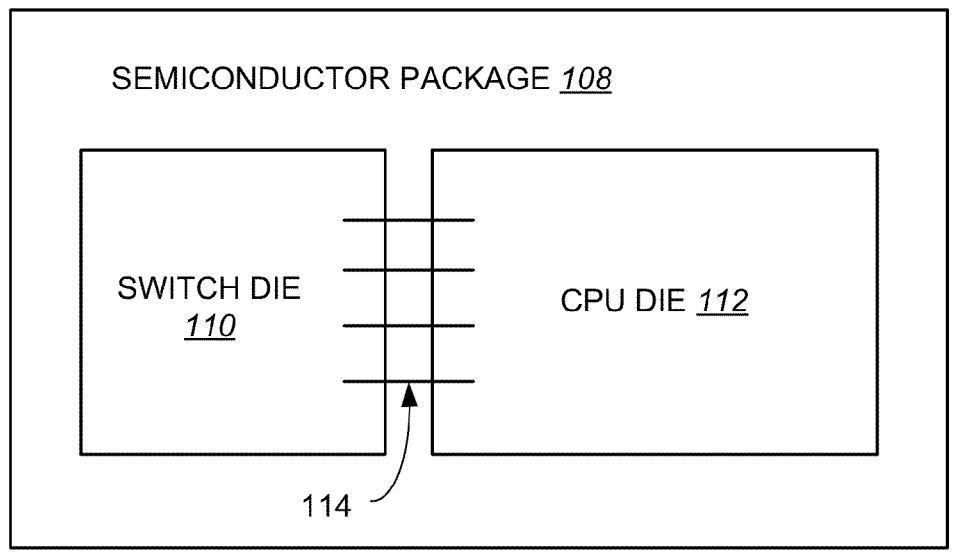
FIG. 1B *(PRIOR ART)*

METHOD AND APPARATUS FOR SUPPLYING POWER TO A SYSTEM ON A CHIP (SOC)

CROSS REFERENCE TO RELATED APPLICATIONS

This disclosure claims priority to U.S. Provisional Patent Application No. 61/491,682, filed on May 31, 2011. This disclosure is related to U.S. patent application Ser. No. 13/345,449, filed on Jan. 6, 2012.

TECHNICAL FIELD

Implementations of the present disclosure relate generally to the field of integrated circuits, and more particularly to techniques, structures, and configurations for providing power to a system on a chip (SOC).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An integrated circuit (also commonly referred to as IC, chip, or microchip) is an electronic circuit manufactured by a patterned diffusion of trace elements into the surface of a thin substrate of semiconductor material (e.g., a semiconductor die). One example of an integrated circuit chip is a system on a chip (SOC). An SOC typically integrates all components of a computer or other electronic system into a single chip. For example, an SOC can contain digital, analog, mixed-signal, and radio-frequency functions—all on a single chip substrate.

Integrated circuit devices, such as transistors, are formed on semiconductor dies having features that continue to scale in size to smaller dimensions. The shrinking dimensions of these features are challenging conventional routing configurations of power signals and/or ground signals for semiconductor dies in an electronic package assembly (or semiconductor package). For example, the routing of power signals and/or ground signals using conventional pin technologies for multiple semiconductor dies in a same semiconductor package may considerably increase manufacturing cost of the semiconductor package. In general, a semiconductor package is a metal, plastic, glass, or ceramic casing containing one or more semiconductor components (e.g., one or more semiconductor dies). Individual discrete components are typically etched in a silicon wafer before being cut and assembled in a semiconductor package. A semiconductor package generally i) provides protection against impact and corrosion, ii) holds contact pins or leads which are used to connect circuits internal to the semiconductor package to circuits external to the semiconductor package, and iii) dissipates heat produced in the semiconductor package.

FIG. 1A illustrates a conventional semiconductor package 100 that includes a single semiconductor die 102 (or chip). A central processing unit (CPU) 104 and a plurality of switches 106 (located along and/or around the periphery of the CPU 104) are integrated on the single semiconductor die 102. In the example of FIG. 1A, the plurality of switches are coupled to the CPU 104 via a metal interconnect layer 108 within the semiconductor die 102. FIG. 1B illustrates a conventional semiconductor package 108 including two separate semiconductor dies—a first semiconductor die including a switch (switch die 110) and a second semiconductor die including a CPU (CPU die 112). The switch die 110 is coupled to the CPU die 112 via a plurality of wirebonds 114. In the example of FIG. 1B, each of the switch die 110 and the CPU die 112 respectively have a power plane and a ground plane.

In both the examples of FIGS. 1A-1B, as a result of the switches being located outside of the periphery of the CPU, when power is needed for the interior circuitry within the CPU, traces or electrical connections (not illustrated) typically have to extend from the periphery of the CPU to the interior of the CPU. Power is often lost or wasted along such traces or electrical connections (due to IR drops), thus preventing a CPU from utilizing power efficiently which, in turn, affects an overall performance of the CPU. Also, in a semiconductor die including two or more CPUs, the differences in IR drops along respective traces to the CPUs can prevent the CPUs from being operated at a same voltage.

FIG. 1C illustrates a top view of a conventional semiconductor die 110. The semiconductor die 110 includes a plurality of solder bumps—including a plurality of solder bumps dedicated to handling signals (S), and a plurality of solder bumps dedicated to handling power (P). The solder bumps are typically deposited on chip pads (not shown) on the top side of a wafer during a final wafer processing step. In order to mount the semiconductor die 110 to external circuitry (e.g., a circuit board or another chip, die, or wafer), the semiconductor die 110 is flipped over so that the top side of the semiconductor die faces down, and aligned so that the pads of the semiconductor die 110 align with matching pads on the external circuit, and then the solder is flowed to complete the interconnect. This is in contrast to wire bonding, in which a chip is mounted upright and wires are used to interconnect the chip pads to external circuitry. As more devices and functionality are increasingly being implemented on a single chip, reducing the number of solder balls dedicated to handling power becomes increasingly important in terms of performance.

SUMMARY

In general, in one aspect, the present specification describes a semiconductor package including i) a first semiconductor die and ii) a second semiconductor die vertically stacked on top of the first semiconductor die. The first semiconductor die includes a first electronic component and a second electronic component, in which the first electronic component operates in accordance with power associated with a first power domain, and the second electronic component operates in accordance with power associated with a second power domain. The second semiconductor die is configured to supply the power associated with the first power domain to the first electronic component of the first semiconductor die, and supply the power associated with the second power domain to the second electronic component of the first semiconductor die.

Potential advantages of one or more implementations disclosed herein may include one or more of the following. Relative to conventional techniques for supplying power to one or more electronic components of a semiconductor package, one or more implementations disclosed herein provide for a reduced IR (voltage) drop so that substantially the same voltage (e.g., +/−1% or less) can be supplied to different electronic components of a semiconductor die. For example, substantially the same voltage can be supplied to two CPUs implemented within a semiconductor die to enhance operational performance of the CPUs. Additionally, a power delivery IC can be fabricated separate from an IC to be powered by the power delivery IC. Accordingly, in some implementation, the power delivery IC can be fabricated using a different fabrication technology (e.g., 90 nm fabrication technology) relative to an IC to be powered by the power delivery IC—e.g., such an IC can be fabricated using 28 nm fabrication technology (which is more expensive than 90 nm fabrication technology).

The details of one or more implementations are set forth in the accompanying drawings and the description below. Other features and advantages will be apparent from the description and drawings, and from the claims.

BRIEF DESCRIPTION OF THE DRAWINGS

FIGS. 1A-1B schematically illustrate examples of a conventional semiconductor package that includes a CPU and a switching array arranged around (or outside) a periphery of the CPU.

Like reference symbols in the various drawings indicate like elements.

DETAILED DESCRIPTION

The present disclosure describes techniques, structures, and configurations for implementing a power delivery IC to supply power to electronic components within a semiconductor package. In one implementation, one or more power delivery ICs can placed vertically on top of a second IC (or semiconductor die) to supply power to various electronic components of the second IC.

Figure 2A:
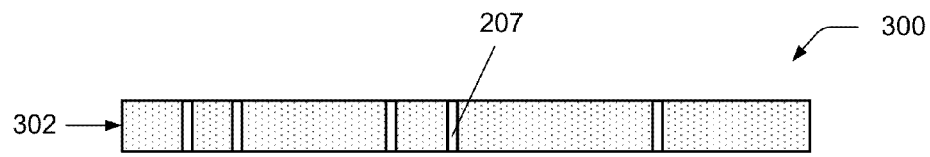
FIGS. 2A-2E illustrate cross-sectional side views of various stages for fabricating a power delivery IC in accordance with one implementation.

FIGS. 2A-2G illustrate cross-sectional side views of various stages for fabricating a power delivery IC 200 in accordance with one implementation. FIG. 2A illustrates a silicon layer or semiconductor substrate 202. The semiconductor substrate 202 comprises, for example, silicon (Si), silicon-germanium (SiGe), germanium (Ge), gallium arsenide (GaAs), or the like. A plurality of through silicon vias (TSVs) 207 can be formed within the semiconductor substrate 202, which can permit power and/or ground to flow through the semiconductor substrate 202—e.g., from a first surface of the semiconductor substrate 202 to a second surface of the semiconductor substrate 202, as described in greater detail below. The through silicon vias 207 can be conventionally formed using metal. Through silicon vias are also more generally referred to as "vias" herein.

In embodiments, a base metal layer (not illustrated) can be included over the semiconductor substrate 202. The base metal layer can include, for example, aluminum (Al), aluminum-copper alloy, copper (Cu), or nickel (Ni). Such a base metal layer can be deposited by processes such as, for example, electrodeposition, evaporation, or a sputtering process. The base metal layer can provide input/output (I/O) functionality for the power delivery IC 200. The base metal layer can also serve as a redistribution layer (RDL) for the power delivery IC 200.

Figure 2B:
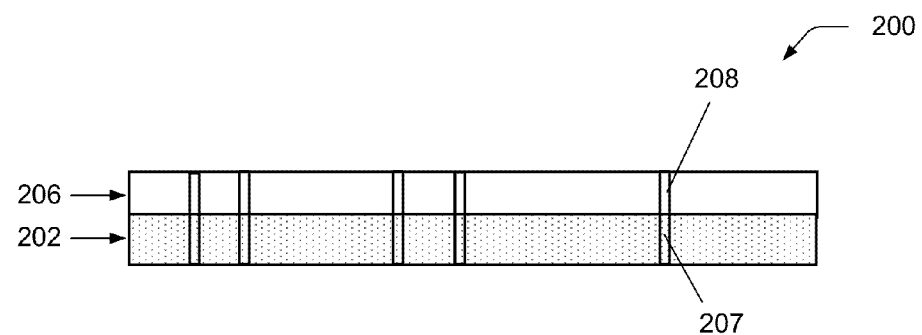

FIG. 2B illustrates an insulating layer 206 formed over the semiconductor substrate 202. The insulating layer 206 can be formed with any dielectric material including, epoxy, polyimide, low-k dielectric, silicon dioxide ($SiO_2$), or the like. The insulating layer 206 separates the respective conducting parts or layers of the power delivery IC 200 from one another and protects the semiconductor substrate 202 from other conducting metal layers of the power delivery IC 200.

A number of device features can be formed in the insulating layer 206. The device features can include, for example, bondable traces, a plurality of lines, and a plurality of through silicon vias 208. As illustrated, the through silicon vias 208 serve as connectors in the insulating layer 206 to allow a conductive connection between different layers of the power delivery IC 200. For example, the through silicon vias 208 serve as contacts by connecting the semiconductor die 202 to different conductors, such as additional metal layers of the power delivery IC 200. In one implementation, the through silicon vias 208 are conventionally formed using metal.

Figure 2C:
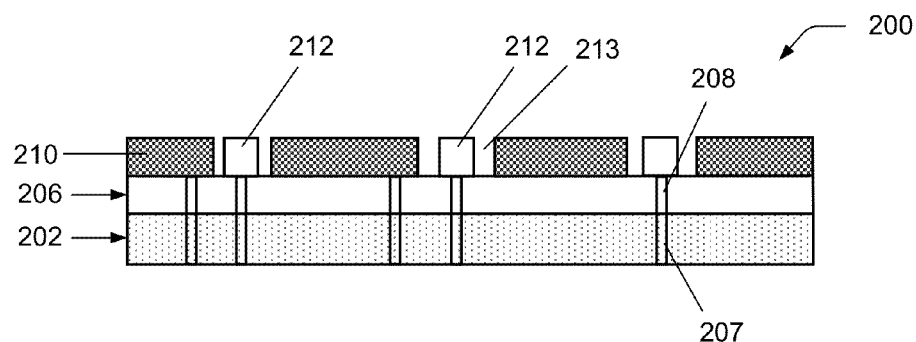

FIG. 2C illustrates a first metal layer 210 formed over the insulating layer 206. The first metal layer 210 can include, for example, copper (Cu), aluminum (Al), aluminum-copper alloy, aluminum-silicon alloy, nickel (Ni), or the like.

In various implementations, an electroplating process, an electrochemical deposition process, or a sputtering process deposits the first metal layer 210 over the insulating layer 206. In yet another implementation, a damascene process deposits a thin layer of copper that serves as the first metal layer 210 over the insulating layer 206. The first metal layer 210 can be chemically and mechanically planarized in some embodiments. Those skilled in the art are familiar with such processes and thus, these processes will not be described in greater detail herein.

A plurality of islands 212 defined by one or more openings 213 is formed in the first metal layer 210. The islands 212 can have different dimensions and/or shapes with respect to each other if desired. For example, the plurality of islands 212 generally has a substantially rectangular-shape. In embodiments, the shapes for the plurality of islands 212 can include, but are not limited to, a substantially square-shape, a substantially oval-shape, and a substantially round-shape.

In an embodiment, the plurality of islands 212 is located in a center of the first metal layer 210. The plurality of islands 212 provides an electrical pathway between layers of the power delivery IC 200. The plurality of islands 212, as well as the openings 213, (in one implementation) also provides stress relief with respect to the first metal layer 210. The location of the plurality of islands 212 in the center of the first metal layer 210 provides for a shorter electrical path between the layers of the power delivery IC 200, as will be discussed in further detail herein. The shorter electrical path leads to better electrical performance, based on less inductance and less resistance being generated.

In an embodiment, the first metal layer 210 is a solid ground (GND) plane. The first metal layer 210 isolates the signals on top of the GND plane from the signals below the GND plane. In particular, the first metal layer 210 isolates the noise for the signals below within the semiconductor substrate 202, especially during high current switching. The plurality of islands 212 in the first metal layer 210 is configured to connect a signal, for example, such as VDD, from another layer through the first metal layer 210 to the semiconductor substrate 202 as discussed in further detail herein. The first metal layer 210 acting as a solid GND plane helps reduce a drop in voltage within the power delivery IC 200.

Figure 2D:
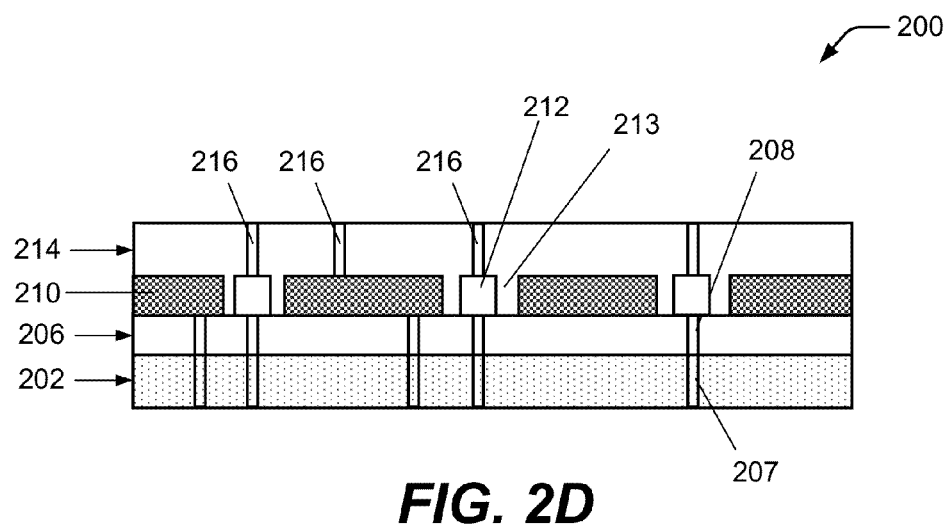

FIG. 2D illustrates a dielectric layer 214 formed over the first metal layer 210. The dielectric layer 214 may be formed of a dielectric material including, for example, oxide, polyimide, low-k dielectric, silicon dioxide (SiO2), or the like. The dielectric layer 214 separates the conducting parts or layers within the power delivery IC 200 from one another, and protects the first metal layer 210 from the other conducting metal layers. In an embodiment, the dielectric layer 214 is an interlayer dielectric layer.

A number of device features can be formed in the dielectric layer 214. The device features may include, for example, bondable traces, a plurality of lines, and a plurality of vias 216. The vias 216 are a connector in the dielectric layer 214 to connect the first metal layer 210 and the semiconductor die 202 to different conductors, such as additional metal layers within the power/ground arrangement 200. In an embodiment, the vias 216 are formed of metal, as is known in the art.

In an embodiment, the vias 216 in the dielectric layer 214 can be positioned in locations that correspond to the locations of the vias 207 of the semiconductor substrate 202, the vias 208 of the insulating layer 206, and islands 212. In other words, the vias 207, 208, 216 and islands 212 can be located in similar positions in their respective layers such that the vias 207, 208, 216 and islands 212 are substantially aligned relative to one another.

Figure 2E:
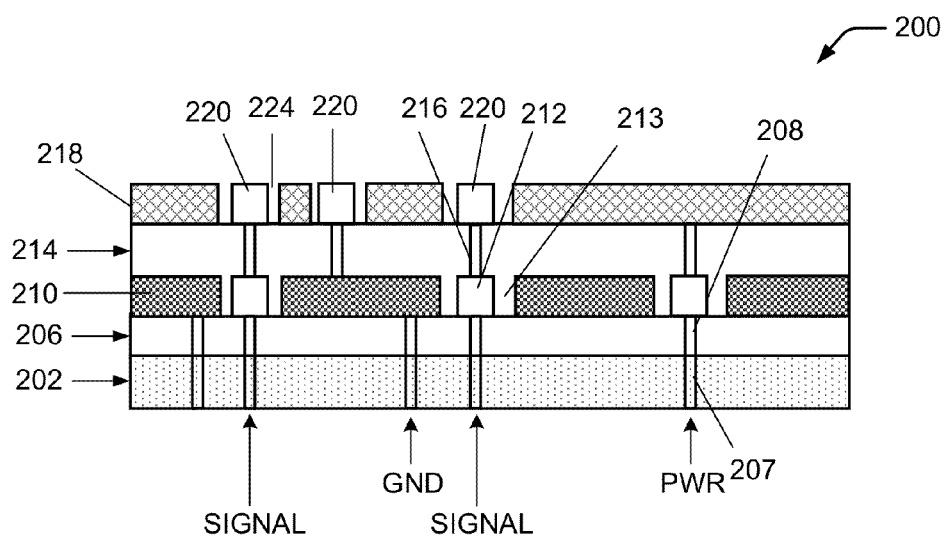

FIG. 2E illustrates a second metal layer 218 formed over the dielectric layer 214. The second metal layer 218 can include, for example, aluminum (Al), aluminum-copper alloy, aluminum-silicon alloy, nickel, or copper (Cu). In embodiments, the second metal layer 218 can be formed over the dielectric layer 214 using suitable processes that are well known, for example, a physical vapor deposition (PVD) process a sputtering process, an electrodeposition, or an evaporative deposition. Those skilled in the art are familiar with such processes and thus, these processes will not be described herein.

A plurality of islands 220, defined by openings 224, is formed on the second metal layer 218 to provide stress relief and to provide electrical pathways. The islands 220 can have different dimensions and/or shapes with respect to each other if desired. For example, in one embodiment, the plurality of islands 220 has a substantially rectangular-shape. In other embodiments, the shapes of the plurality of islands 220 include, but are not limited to, a substantially square-shape, a substantially oval-shape, and a substantially round-shape.

In an embodiment, the plurality of islands 220 are located in a center of the second metal layer 218. The location of the plurality of islands 220 in the center of the second metal layer 218 provides for a shorter electrical path from the second metal layer 218 to a second die to which the power delivery IC 200 is stacked, as will be described in further detail herein. The shorter electrical path provides better electrical performance, based on less inductance and less resistance being generated. In an embodiment, some of the plurality of islands 220 in the second metal layer 218 are positioned in locations that correspond to the locations of some of the plurality of islands 212 of the first metal layer 210. In other words, some of the plurality of islands 220, 212 are located in similar positions on each of their respective metal layers 218, 210 such that the plurality of islands 220, 212 are substantially aligned.

In an embodiment, the second metal layer 218 serves as a power plane, which power plane is configured to provide power at the top of the power delivery IC 200. The second metal layer 218 receives power from an external device (not illustrated) through a wirebond connection and provides power to the semiconductor substrate 202 through the vias 208, 216 and islands 212 and 220 aligned with the vias 208, 216. In various implementations, the power delivery IC 200 is vertically stackable over a second semiconductor die via solder bumps (not shown), and the second semiconductor die can receive power, ground, and or signals from the power delivery IC 200 through vias 207.

A passivation layer (not illustrated) may be formed over the second metal layer 218. The passivation layer may be formed with any suitable material including, for example, oxide, nitride, silicon-oxide, silicon-nitride, or the like. The passivation layer is generally chemically or mechanically planarized. The passivation layer is not required to be planarized if desired. The passivation layer protects the underlying metal layers and the fine-line metal interconnections. The passivation layer also prevents the penetration of mobile ions and other contaminations.

Thus, as can be seen, the power delivery IC 200 includes a ground plane and a power plane, in which the power plane is formed on a separate layer relative to the ground plane (e.g., the first metal layer 210 and the second metal layer 218, respectively) to provide ground and/or power signals to i) the semiconductor substrate 202, as well as ii) a second semiconductor die (stacked below the power delivery IC 200).

Figure 3:
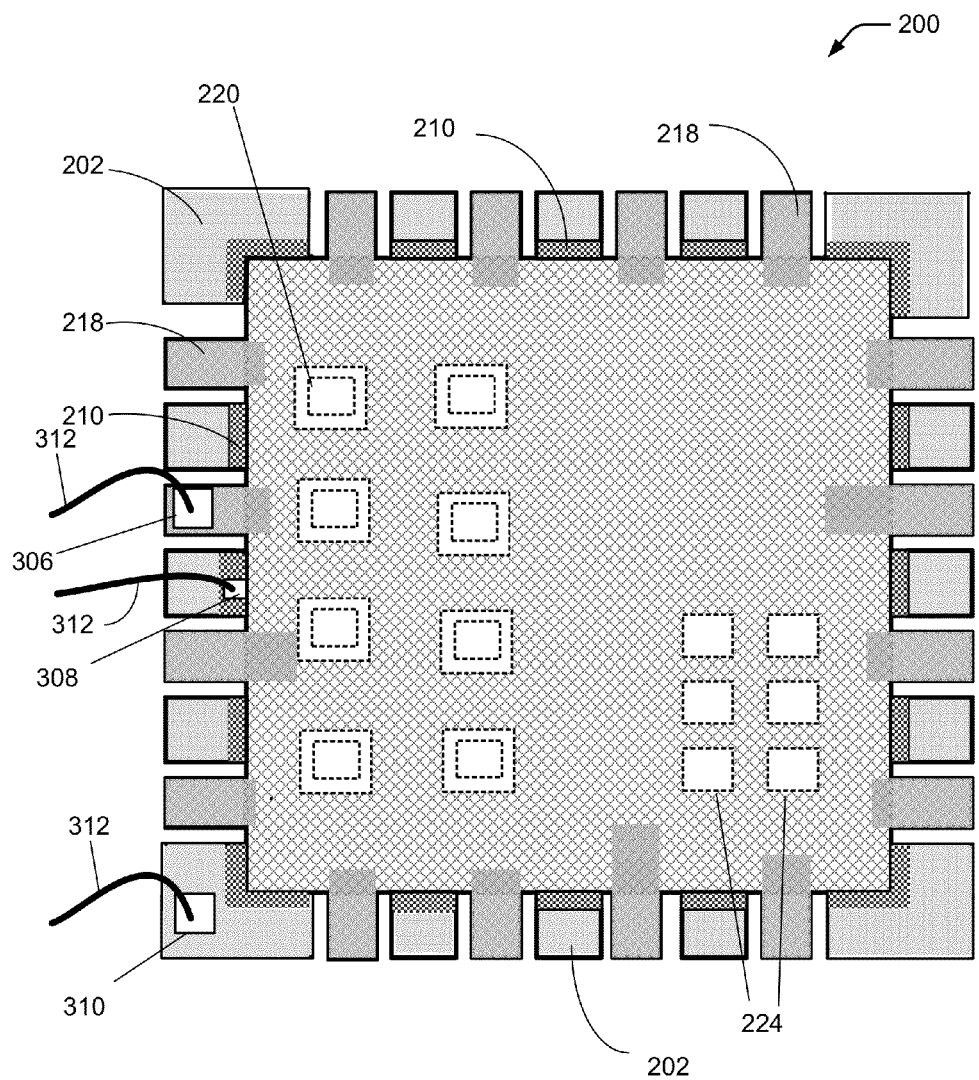
FIG. 3 illustrates a top view of the arrangement of FIGS. 2A-2E.

FIG. 3 illustrates a top view of the power delivery IC 200 of FIGS. 2A-2E. The top view illustrates exposed portions of the semiconductor substrate 202, the second metal layer 218, and exposed portions of the first metal layer 210, as well as the plurality of islands 220 in the second metal layer 218. The exposed portions of the semiconductor substrate 202 and the first metal layer 210 are located along a periphery of the power delivery IC 200 (in one implementation) to allow for wirebond connections to the various layers.

The plurality of islands 220 provides electrical pathways and, in one embodiment, also provides stress relief. Likewise, the one or more openings 224 can provide stress relief, some of which may not define islands 220. For example, the stress in the second metal layer 218 results from differences in thermal expansion or from the microstructure of the second metal layer 218 (intrinsic stress). Locations for the plurality of islands 220 are illustrated as examples, not as actual placement locations. The plurality of islands 220 further represent examples without limiting the number, which may be formed in the second metal layer 218, as well as without limiting a size, dimension or a shape.

FIG. 3 further illustrates examples of multiple contact points. For instance, the contact points provide electrical connections with the bond pads 306, 308, 310 coupled to bondwires 312 at multiple locations. The bond pads 306, 308, 310 are generally located along a peripheral edge of the semiconductor substrate 202 on exposed portions of the semiconductor substrate 202 and the metal layers 210, 218. For example, bond pad 306 is located on the second metal layer 218, bond pad 308 is located on an exposed portion of the first metal layer 210, and bond pad 310 is located on an exposed portion of the semiconductor substrate 202.

In an embodiment, the power (VDD) from an external device (not illustrated) is received at the bond pad 306 located on the second metal layer 218 through a first bondwire 312. In one implementation, the first bondwire 312 is coupled to a dedicated power pin of a semiconductor package. The power is provided from the second metal layer 218 to the semiconductor substrate 202 through pathways defined by a via 216, an island 212 and a via 208 (as illustrated in FIGS. 2B-2E). Isolation is provided in the power delivery IC 200 to avoid unwanted interaction of components with each other. For example, the vias 208, 216 make contact with the first metal layer 210, which serves as the GND plane (VSS) appearing to the signals as an infinite ground potential.

In another embodiment, the GND signal is received at the bond pad 308 of the first metal layer 210 through a second bondwire 312. The GND signal can then be provided to the semiconductor substrate 202 through pathways defined by a via 216, an island 212 and a via 208. Additionally, the plurality of islands 220 provide an electrical pathway of the GND signal from the first metal layer 210 to a second semiconductor die stacked below the power delivery IC 200.

Additionally, an I/O signal can be received at a bond pad 310 of the semiconductor die 202 through a bondwire 312, either from an external device (not illustrated) or from the semiconductor substrate 202. Also, an I/O signal can be brought from the second metal layer 218 through the semiconductor substrate 202 and to a second semiconductor die on which the power delivery IC 200 is stacked. For example, the electrical pathway of the I/O signal begins at the semiconductor substrate 202, passes through the via 208 (illustrated in FIGS. 1B-1E of the cross-sectional views), and passes through an island 212 in the first metal layer 210 (i.e., the GND plane). The electrical pathway further passes through the via 216 (illustrated in FIG. 1E of the cross-sectional views), to the second metal layer 218 (i.e., the power plane).

The power/ground layout of the power delivery IC 200 increases the I/O functionality by providing multiple bond pad sites located on the semiconductor substrate 202, the first metal layer 210, and the second metal layer 218 for the I/O, GND, and/or power signals through the corresponding bondwires 312. In addition, the first metal layer 210 as the GND plane reduces the drop in voltage by providing mechanisms for electrical connections to the different layers in a more efficient manner. Overall, this reduces the drop in voltage and keeps the size of the electronics package small while increasing I/O functionality and keeping costs down.

The roles of the first metal layer 210 and the second metal layer 218 may be reversed such that the first metal layer 210 is the power plane and the second metal layer 218 is the GND plane. Thus, the roles of the plurality of islands 212 in the first metal layer 210 and the plurality of islands 220 in the second metal layer 218 would be reversed such that the plurality of islands 212 in the first metal layer 210 are configured to route the GND signals through the other layers and the plurality of islands 220 in the second metal layer 218 are configured to route the power and I/O signals through the metal layers. For clarity, the Detailed Description will continue to describe the embodiment in which the first metal layer 210 is the GND plane and the second metal layer 218 is the power plane.

Figure 4:
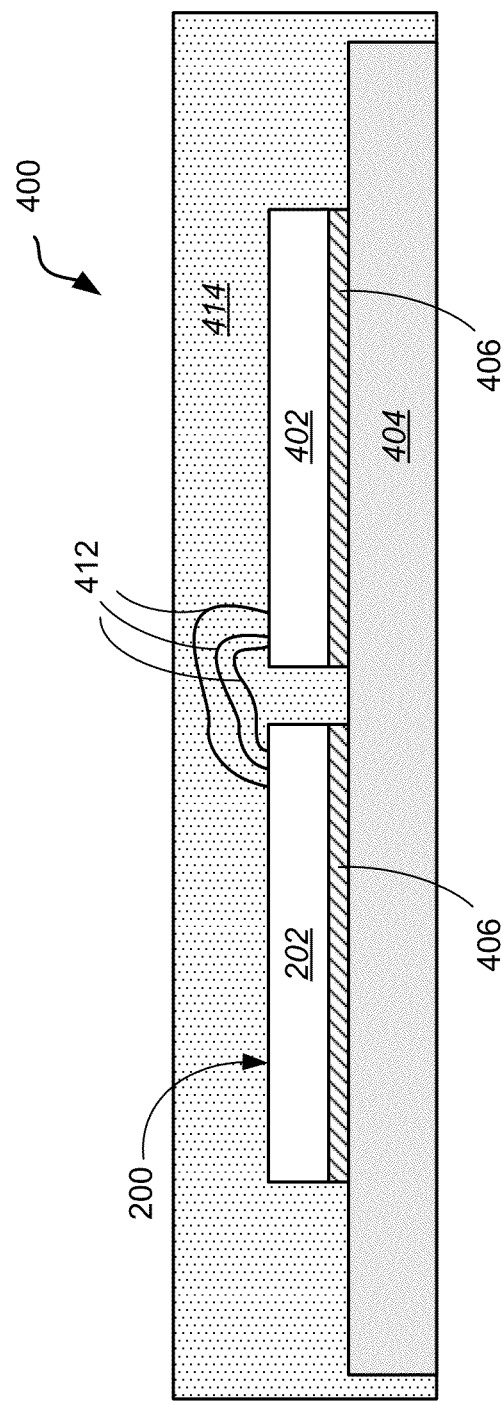
FIG. 4 schematically illustrates a side view of a semiconductor package including the power delivery IC of FIGS. 2A-2E.

FIG. 4 schematically illustrates a side view of a semiconductor package 400 that includes a power delivery IC 200 to provide ground signals and/or power signals to one or more semiconductor dies (e.g., a first semiconductor die 402 and a second semiconductor die 404 of the semiconductor package 400). In one implementation, the semiconductor package comprises a ball grid array package having external leads. In an implementation, the semiconductor package 400 includes power delivery IC 200, a first semiconductor die 402, a second semiconductor die 404, solder bumps 406, one or more bonding wires 412, and molding compound 414, coupled as illustrated.

The power delivery IC 200 and the first semiconductor die 402 are vertically stacked on top of the second semiconductor die 404, as illustrated. The second semiconductor die 404 can include, for example, one or more CPUS and other functional blocks which require power and/or ground signals for operation. In one implementation, the semiconductor package 400 is mountable onto a substrate (e.g., a printed circuit board (PCB)) (not shown).

The first semiconductor die 402 generally comprises a semiconductor material, such as, for example, silicon. The power delivery IC 200 and the first semiconductor die 402 are coupled to the second semiconductor die 404 through solder bumps 406. The power delivery IC 200 and the first semiconductor die 402 can be coupled to the second semiconductor die 404 using any other suitable technique in other implementations.

Figure 5:
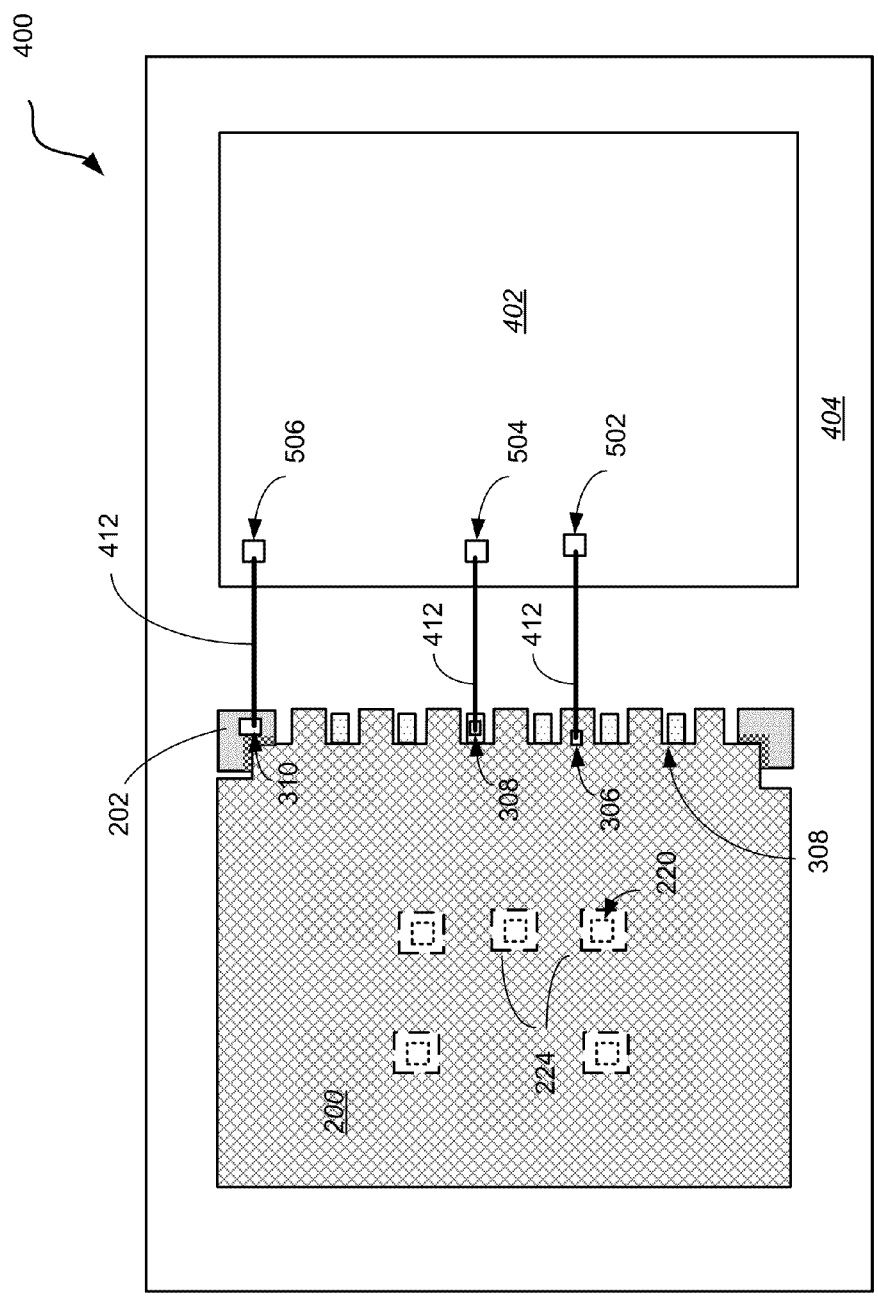
FIG. 5 schematically illustrates a top view of the electronic package assembly of FIG. 4.

FIG. 5 schematically illustrates a top view of the semiconductor package 400 of FIG. 4. The molding compound 414 of FIG. 4 is not depicted in FIG. 5 for the sake of clarity. Power signals can be routed from the power delivery IC 200 to the first semiconductor die 402 using one or more bonding wires 412. As can be seen, the second metal layer 218 at bond pad 306 is electrically coupled to, for example, a bond pad 502 on a surface of the first semiconductor die 402 using a bonding wire 412. In this manner, the power delivery IC 200 is configured to route power signals to the first semiconductor die 402. In one implementation, the first semiconductor die corresponds to a memory IC (e.g., SRAM). Additional bonding wires 412 and bonding pads 306, 502 may be used to route power signals between the power delivery IC 200 and the first semiconductor die 402.

Ground signals can be routed from the power delivery IC 200 to the first semiconductor die 402 using one or more bonding wires 412. As can be seen, the first metal layer 210 at bond pad 308 is electrically coupled to a bond pad 504 on the surface of the first semiconductor die 402 using a bonding wire 412. In this manner, the power delivery IC 200 is configured to route ground signals to the first semiconductor die 402. More bonding wires 412 and bonding pads 308, 504 may be used to route ground signals between the power delivery IC 200 and the first semiconductor die 402 if desired.

Signals can be routed to and from the second semiconductor die 404 to the first semiconductor die 402 using one or more bonding wires 412. As can be seen, the semiconductor substrate 202 at bond pad 310 is electrically coupled to a bond pad 506 on the surface of the first semiconductor die 402 using a bonding wire 412. In this manner, the power delivery IC 200 is configured to route signals between the second semiconductor die 404 (e.g., a CPU die) and the first semiconductor die 402 (e.g., a memory die). More bonding wires 412 and bonding pads 310, 506 may be used to route signals between the second semiconductor die 404 and the first semiconductor die 402 if desired.

The first semiconductor die 402 is positioned adjacent and side-by-side to the power delivery IC 200, wherein both of the first semiconductor die 402 and the power delivery IC are vertically stacked on top of the second semiconductor die 404. In an implementation, the second semiconductor die 404 within the semiconductor package 400 comprises a processor (e.g., system-on-a-chip) and the first semiconductor die 402 comprises memory. In the implementations of FIGS. 4-5 where the first semiconductor die 402 comprises memory, the memory only needs connections to the power delivery IC 200 along one side in order to interact with the second semiconductor die 404, and receive power signals and/or ground signals from the power delivery IC 200.

Although only two semiconductor dies (e.g., first semiconductor die 402 and second semiconductor die 404) are depicted/described in the semiconductor package 400 of FIGS. 4 and 5, additional semiconductor dies can be disposed within the semiconductor package 400 either in a stacked configuration or side-by-side configuration in other implementations. The additional semiconductor dies can likewise be coupled to the power delivery IC 200 for routing of power signals and/or ground signals using techniques as described herein. For example, the various layers of the power delivery IC 200 can be exposed on multiple edges of the power delivery IC 200 (as illustrated in FIG. 3) to facilitate electrical coupling of additional semiconductor dies to the power delivery IC 200 using bond pads and bonding wires as described herein. Furthermore, bonding wires may be coupled to islands 220 to route signals to additional semiconductor dies. Also, one or more additional semiconductor dies may be stacked on top of power delivery IC 200, using known techniques, such that the one or more additional semiconductor dies are communicatively coupled with islands 220 to receive signals from the power delivery IC 200.

In some embodiments, a molding compound 414 is formed to substantially encapsulate the power delivery IC 200, the first semiconductor die 402, the second semiconductor die 404, and the one or more bonding wires 412. The molding compound 414 generally comprises an electrically insulative material, such as a thermosetting resin, that is disposed to protect each of the power delivery IC 200, the first semiconductor die 402, and the second semiconductor die 404 from moisture, oxidation, or chipping.

Figure 6A:
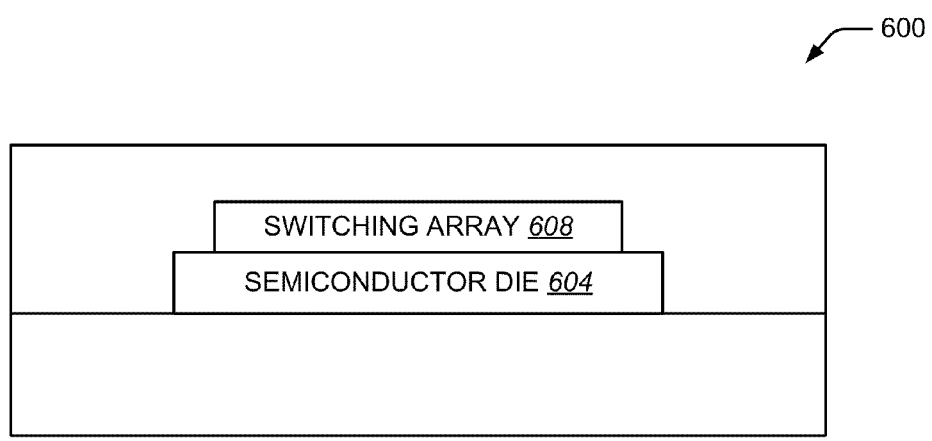
FIG. 6A schematically illustrates a package that includes a semiconductor die and a switching array arranged on top of the semiconductor die.

Referring to FIG. 6A, a semiconductor package 600 is illustrated that includes a semiconductor die 604. In accordance with various embodiments, the semiconductor die 604 is configured as a central processing unit (CPU). The semiconductor package 600 further includes a switching array 608 disposed on top of the semiconductor die 604. In one implementation, the switching array 608 is a power delivery IC (e.g., power delivery IC 200 as discussed above). The size of the switching array 608 generally approximates the size of the semiconductor die 604. In accordance with various implementations, the switching array 608 may be identically sized to the semiconductor die 604, or may be different in size with respect to the semiconductor die 604. Furthermore, the switching array 608 may be formed in a separate die that is then coupled to the semiconductor die 604. The switching array 608 and the semiconductor die 608 can be fabricated using the same or different fabrication processes.

Figure 6B:
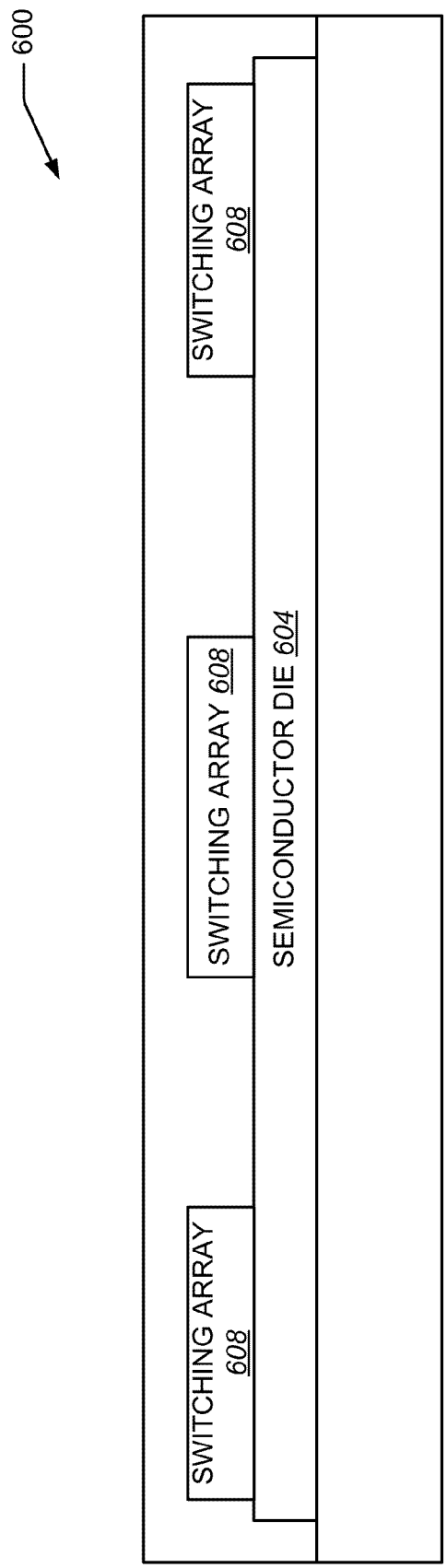
FIG. 6B schematically illustrates a package that includes a semiconductor die and multiple switching arrays arranged on top of the semiconductor die.

FIG. 6B illustrates another embodiment of semiconductor package 600 wherein multiple switching arrays 608 are disposed on top of the semiconductor die 604. It should be understood that other components (not shown), such as, a heat sink, and other semiconductor dies, may be disposed on top of the multiple switching arrays 608. Depending on the design, one or more of the switching arrays 608 may function solely as structural support for components residing on top. For example, the switching array 608 in the middle may provide switching functions and structural support, while the left and the right switching arrays 608 may function solely as structural support for a heat sink (not shown) disposed on top of the switching arrays 608.

In accordance with various embodiments, the switching array 608 is formed as a power delivery IC 200 in a manner similar to that described with respect to FIGS. 2A-2E. In one implementation, a silicon layer or semiconductor substrate (corresponding to semiconductor substrate 202) within the switching array 608 is configured to include a plurality of switches and capacitors. The switching array 608 also includes a ground plane and a power plane, e.g., first metal layer 210 and second metal layer 218, in which the ground plane is separate from the power plane.

Figure 7A:
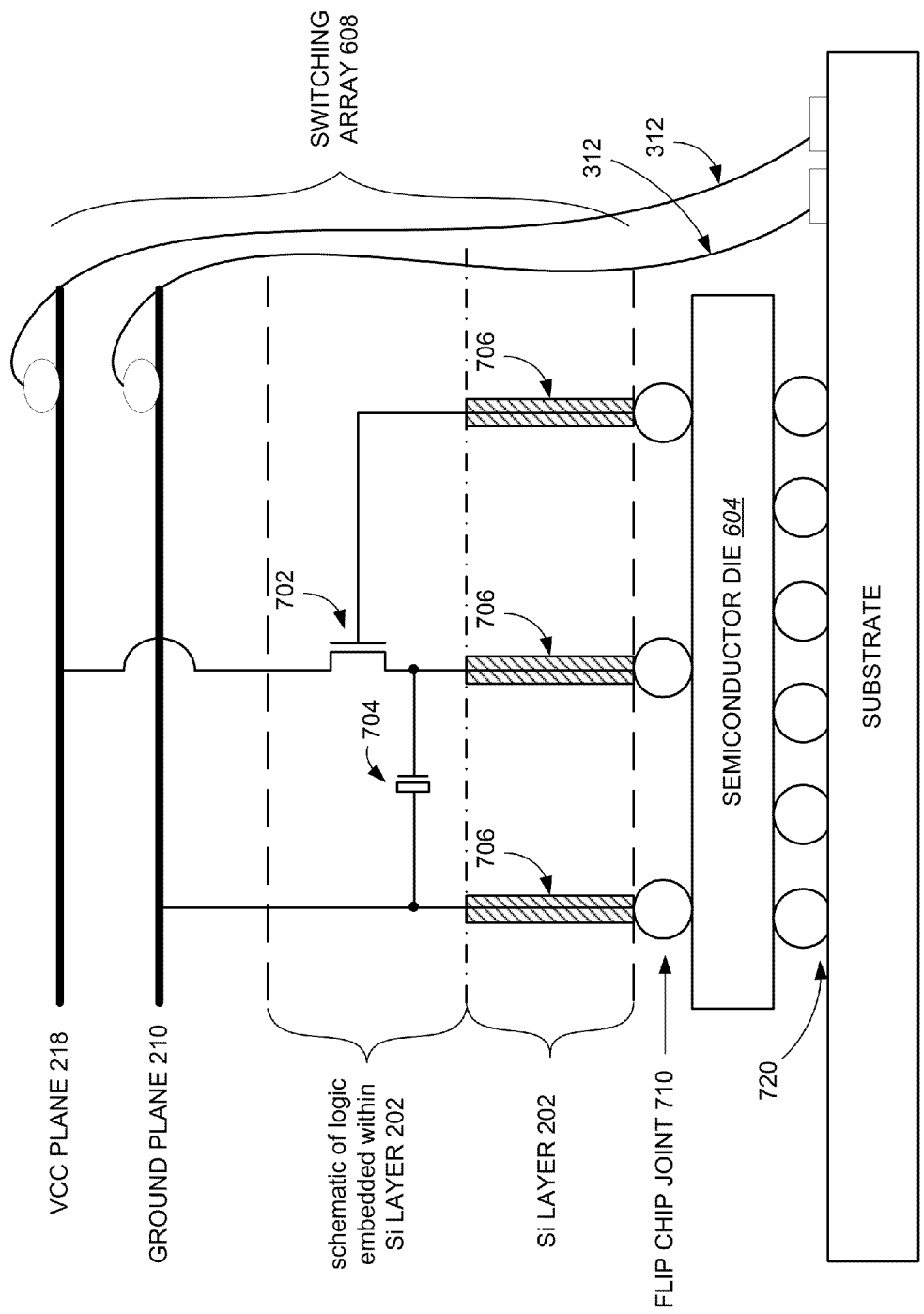
FIGS. 7A-7C schematically illustrate embodiments of the switching array of FIG. 6A.

Referring to FIG. 7A, a partial schematic view of the switching array 608 and the semiconductor die 604 is illustrated. For the sake of clarity, only one switch 702 and one capacitor 704 are illustrated. It should be understood that the switching array 608 can include multiple switches and capacitors in other implementation as shown in FIG. 7C. For example, in such implementation as shown in FIG. 7C, the switching array 608 can include a plurality of switches 750 and a power management unit 752. The plurality of switches can respectively support one or more power domains V1, V2, . . . Vn (e.g., 1V, 3.3V, 5V, and so on) as required by various electronic components disposed within a semiconductor package. In one implementation, the power management unit 752 controls each of the switches 752 via a control signals 754 received off chip (e.g., from a semiconductor die on which the switching array 608 is stacked. In one implementation, the one or more capacitors store power to reduce power-to-ground noise issues with respect to the supply of power to the switching array 608.

Figure 1C:
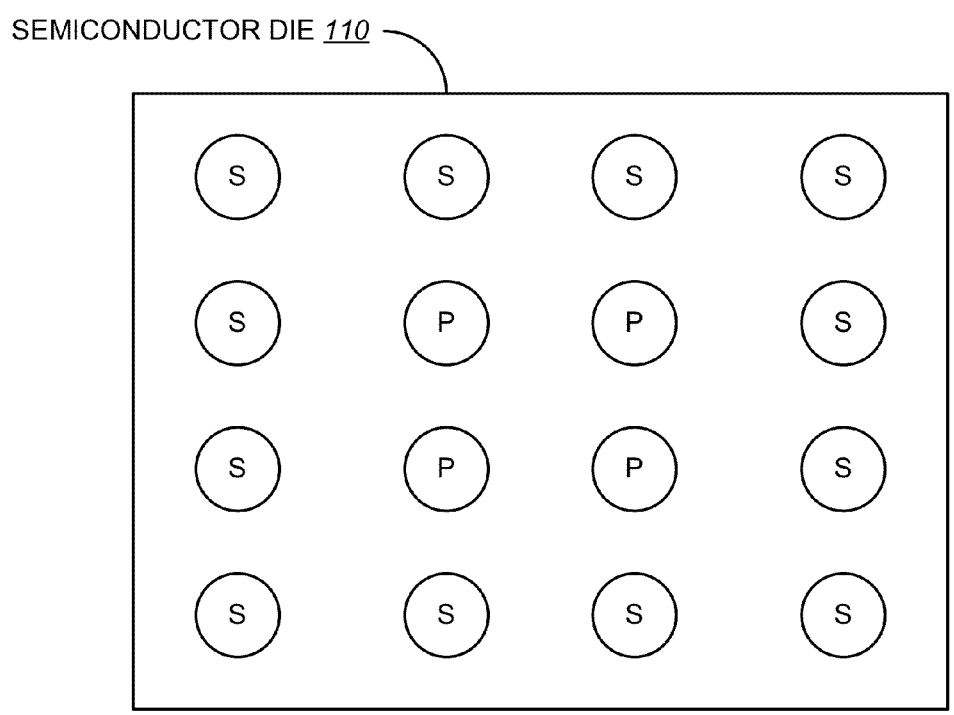
FIG. 1C illustrates a conventional semiconductor die including a plurality of solder balls.

Referring to FIG. 7A, the switch 702 and the capacitor 704 are formed within the silicon layer 202 and are coupled to the semiconductor die 604 through an electrical path comprising (through-silicon) vias 706 and a flip chip joint 710. The flip chip joint 710 can be, for example, a solder bump, a gold bump, copper bump, and so on. The vias 706 are defined within the Si layer 202. The ground plane 210 and the power plane 218 are in separate layers and formed in a manner at least similar to the methods previously described with respect to FIGS. 2A-2E. In contrast to conventional techniques for supplying power to a semiconductor die (as shown in FIG. 1C), power to semiconductor die 604 is provided by switching array 608, and each bump underneath the semiconductor die 604 (e.g., bumps 720) can be dedicated to handing signals.

Figure 7B:
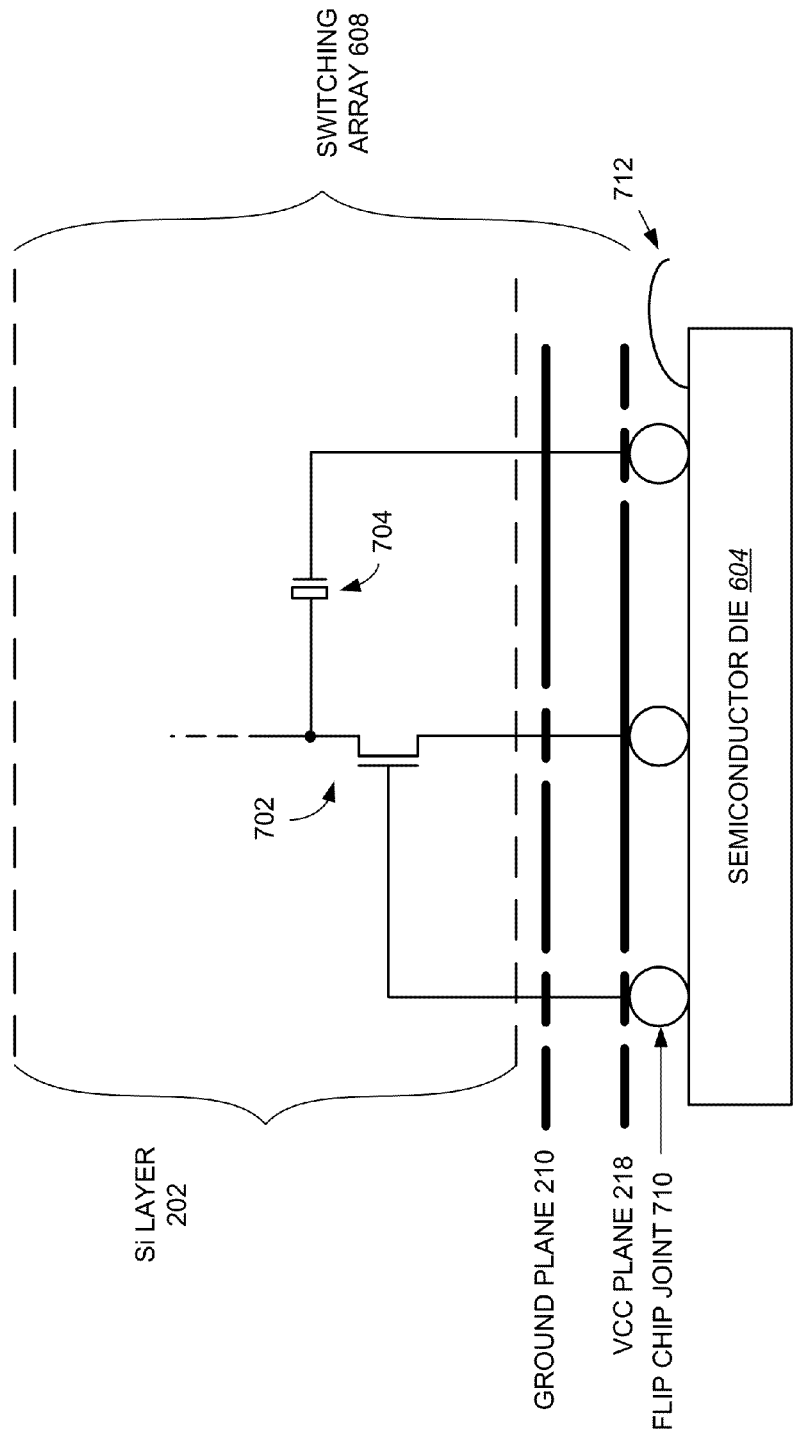
Figure 7C:
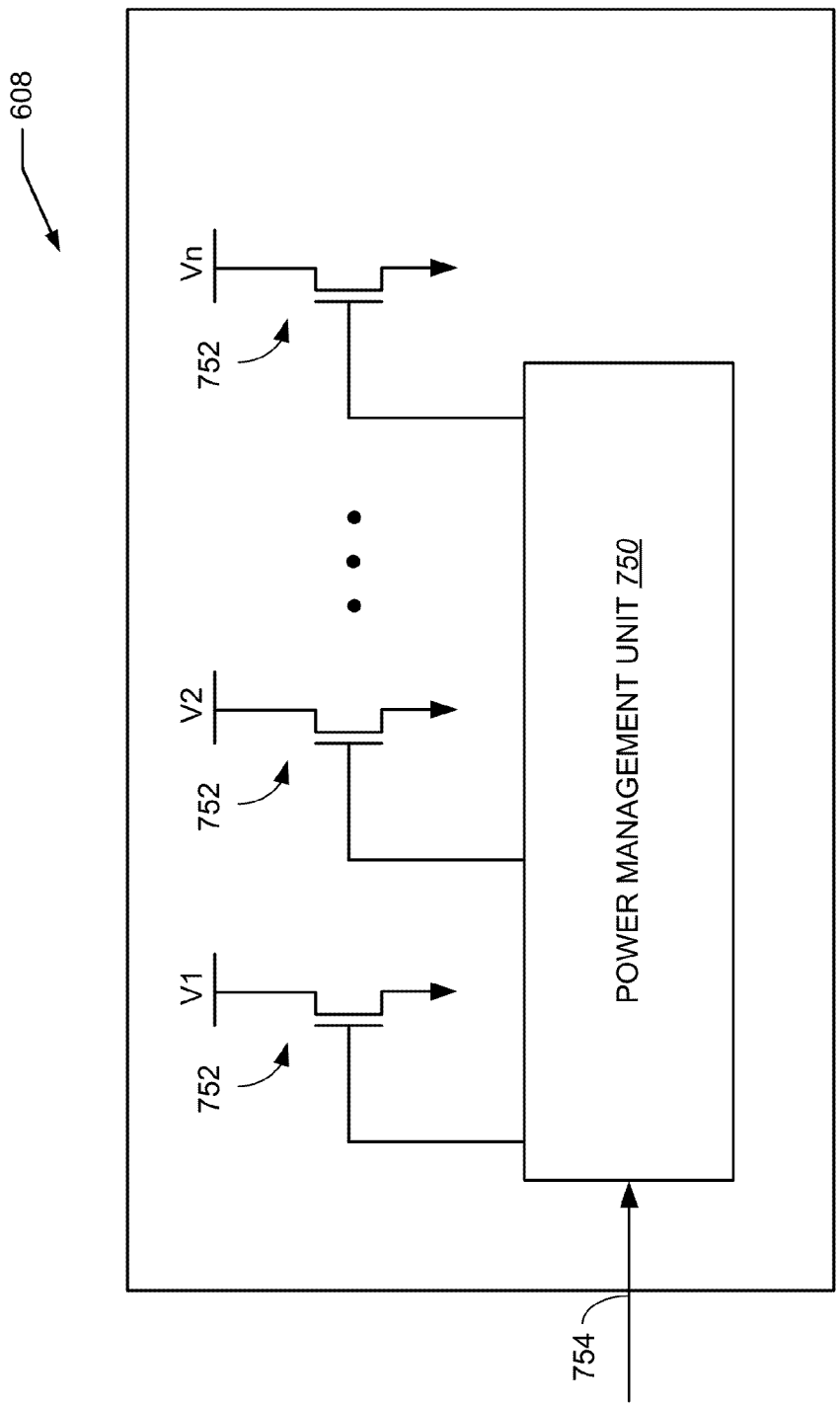

FIG. 7B illustrates another embodiment of the switching array 608. Once again, for the sake of clarity, only one switch 702 and one capacitor 704 are illustrated, but it should be understood that the switching array 608 can include multiple switches and capacitors. The power plane 218 and the ground plane 210 are situated between the switch 702 and the capacitor 704 configuration and the semiconductor die 604. In an embodiment, the switching array 608 is connected to the semiconductor die 604 via a flip chip joint 710. The flip chip joint 710 can be formed through a flip chip operation, and the flip chip joint 710 generally provides connections at various bonding pads (not illustrated) on the switching array 608 and bonding pads on the semiconductor die 604. In an implementation, one or more bonding wires 712 provide an electrical path for signals to and/or from the semiconductor die 604.

Figure 8:
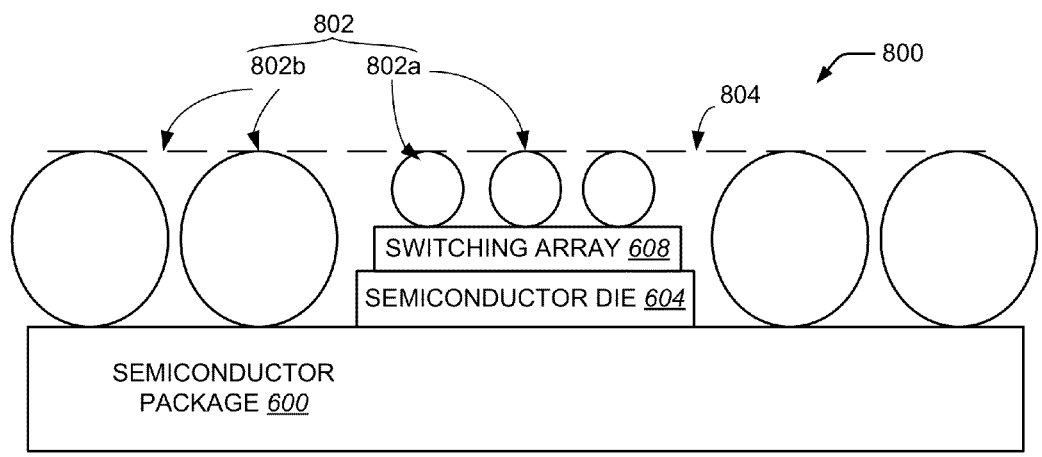
FIG. 8 schematically illustrates the package of FIG. 6A including solder balls.

FIG. 8 illustrates an embodiment of a package arrangement 800 wherein solder balls or bumps 802 are added to the semiconductor package 600. As can be seen, due to the slight increase in thickness where the switching array 608 is on top of the semiconductor die 604, the solder balls 802a are slightly smaller than the solder balls 802b. Thus, the semiconductor package 600 with the solder balls 802 is generally the same height with respect to line 804. In other embodiments, the switching array 608 and the semiconductor die 604 may be very thin relative to the solder balls or bumps 802b, and thus, solder balls or bumps 802a and 802b have substantially the same size and height.

Figure 9:
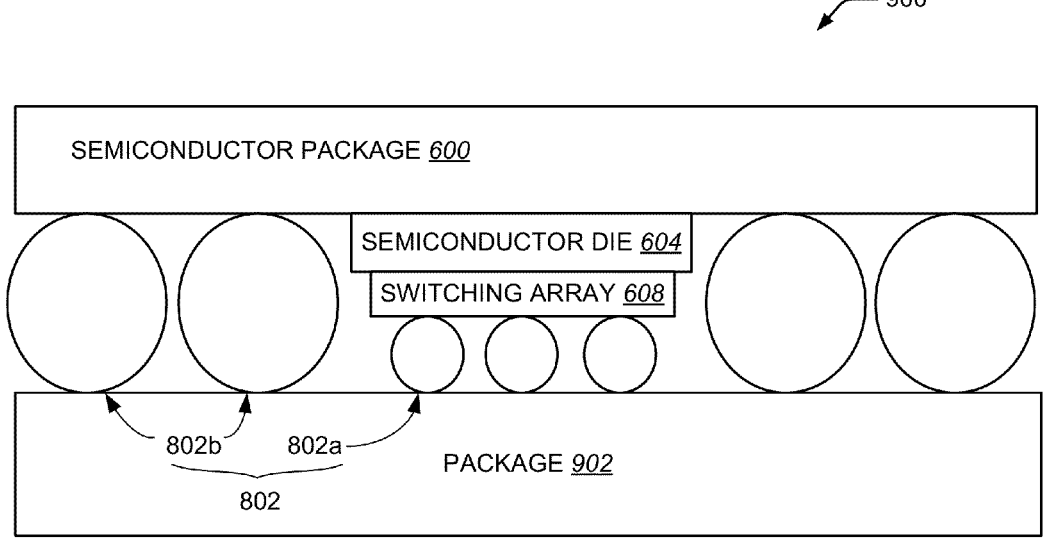
FIG. 9 schematically illustrates a package including the package of FIG. 6A coupled to a ball grid array (BGA) package with the solder balls illustrated in FIG. 8.

FIG. 9 illustrates an embodiment a package arrangement 900 wherein the package arrangement 800 of FIG. 8 is flipped onto a package 902, e.g., a ball grid array (BGA) via a flip chip operation. The solder balls 802 provide electrical connections between the semiconductor package 600, including the semiconductor die 604 and switching array 608, and the BGA 902. In other embodiments, other electrical connections that are known may be used in place of the solder balls 802. For example, the semiconductor package 600 and the BGA 902 may not be stacked on top of each other, but rather may be in a side by side arrangement and thus, bonding wires may be used.

Signals between the BGA 902 and the semiconductor die 604 (including signals from the power and ground planes) may be provided through the solder balls 802 and through the switches 702 and capacitors 704 of the switching array 608, as well as the vias defined within the power/ground arrangement 200 and/or the intermediate layer 708. With the switching array 608 located on top of the semiconductor die 604, delivery of power to the semiconductor die 604 is more efficient. This is generally due to the fact that the distance from the switching array 608 to the interior of the semiconductor die 604 is shorter and more direct, thus reducing power loss or waste along the traces or electrical connections. In general, the switching array 608 is generally maintained as thin as possible. In accordance with various embodiments, the switching array 608 has a thickness of approximately 20 microns. Additionally, while the switching array 608 has been described as being formed in a manner similar to that with respect to power/ground arrangement 200 and then coupled to the semiconductor die 604, the switching array 608 may be formed directly on the semiconductor die 604.

Figure 10:
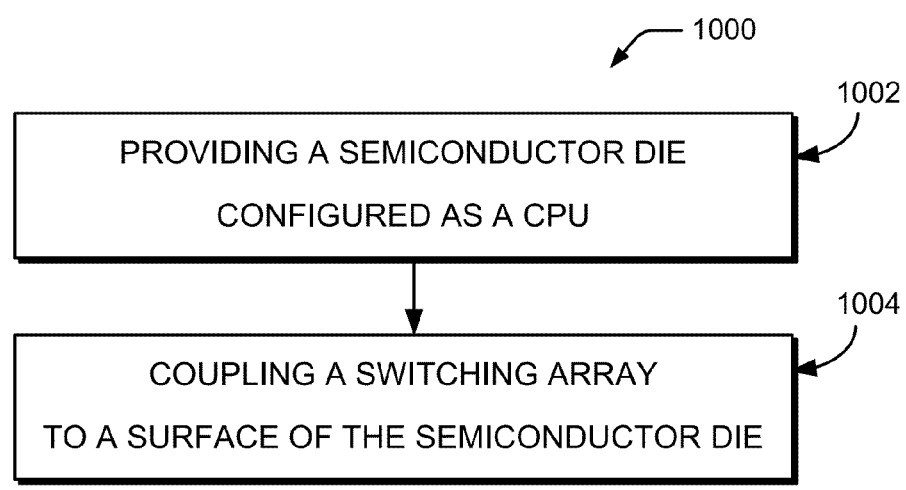
FIG. 10 is a process flow diagram of a method to fabricate a semiconductor package described herein.

FIG. 10 is a process flow diagram of a method 1000 to fabricate a semiconductor package (e.g., semiconductor package 600 of FIG. 6A) described herein. At 1002, the method 1000 includes providing a semiconductor die configured as a CPU. At 1004, the method further includes coupling a switching array to a surface of the semiconductor die. In an embodiment, the switching array is coupled to the semiconductor die via a flip chip operation. In another embodiment, the switching array is coupled to the semiconductor die by forming the switching array on the surface of the semiconductor die. In another embodiment, the switching array is coupled to the semiconductor die via an intermediate layer.

The description may use perspective-based descriptions such as over/under. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. For example, although semiconductor die 604 is described as being configured as a CPU, the semiconductor die 604 can be generally configured to implement any logic or circuitry requiring a ground and power for operation. This disclosure is intended to cover any adaptations or variations of the embodiments discussed herein. Therefore, it is manifestly intended that embodiments described herein be limited only by the claims and the equivalents thereof.

What is claimed is:

1. A semiconductor package comprising:
a first semiconductor die including a first electronic component and a second electronic component, wherein the first electronic component of the first semiconductor die operates in accordance with power associated with a first power domain, wherein the second electronic component of the first semiconductor die operates in accordance with power associated with a second power domain, and wherein the power associated with the first power domain is different from the power associated with the second power domain; and
a second semiconductor die vertically stacked on top of the first semiconductor die, wherein the second semiconductor die is configured to
supply the power associated with the first power domain to the first electronic component of the first semiconductor die, and
supply the power associated with the second power domain to the second electronic component of the first semiconductor die.

2. The semiconductor package of claim 1, wherein the second semiconductor die is vertically stacked on top of the first semiconductor die via a flip chip joint.

3. The semiconductor package of claim 2, wherein the flip chip joint comprises a plurality of solder bumps.

4. The semiconductor package of claim 1, wherein the second semiconductor die is further configured to supply ground to each of the first electronic component of the first semiconductor die and the second electronic component of the first semiconductor die.

5. The semiconductor package of claim 1, wherein the first power domain is different from the second power domain.

6. The semiconductor package of claim 1, wherein:
the first semiconductor die further comprises a third electronic component, wherein the third electronic component of the first semiconductor die operates in accordance with power associated with a third power domain; and
the semiconductor package further comprises a third semiconductor die vertically stacked on top of the first semiconductor die, wherein the third semiconductor die is configured to supply the power associated with the third power domain to the third electronic component of the first semiconductor die.

7. The semiconductor package of claim 1, wherein:
- the second semiconductor die comprises a power management unit configured to control, based on a control signal, i) the supply of the power associated with the first power domain to the first electronic component of the first semiconductor die, and ii) the supply of the power associated with the second power domain to the second electronic component of the first semiconductor die; and
- the control signal is received by the power management unit from the first semiconductor die.

8. The semiconductor package of claim 1, wherein:
- the first semiconductor die has been fabricated in accordance with a first fabrication technology; and
- the second semiconductor die has been fabricated in accordance with a second fabrication technology.

9. The semiconductor package of claim 8, wherein the first fabrication technology is different from the second fabrication technology.

10. The semiconductor package of claim 9, wherein the first fabrication technology corresponds to a 28 nm fabrication technology, and the second fabrication technology corresponds to a 90 nm fabrication technology.

11. The semiconductor package of claim 1, wherein the semiconductor package comprises a ball grid array package having a plurality of external leads.

12. The semiconductor package of claim 11, wherein:
- a first lead of the plurality of leads is dedicated to supplying the power associated with the first power domain to the second semiconductor die; and
- a second lead of the plurality of leads is dedicated to supplying the power associated with the second power domain to the second semiconductor die.

13. The semiconductor package of claim 12, further comprising:
- a first wirebond coupled between the first lead and the second semiconductor die, wherein the power associated with the first power domain is configured to be supplied from the first lead to the second semiconductor die via the first wirebond; and
- a second wirebond coupled between the second lead and the second semiconductor die, wherein the power associated with the second power domain is configured to be supplied from the second lead to the second semiconductor die via the second wirebond.

14. The semiconductor package of claim 1, further comprising:
- a third semiconductor die vertically stacked on top of the first semiconductor die, wherein third semiconductor die includes a third electronic component that operates in accordance with the power associated with a first power domain,
- wherein the second semiconductor die is configured to supply the power associated with the first power domain to the third electronic component of the third semiconductor die.

15. The semiconductor package of claim 14, further comprising:
- a wirebond coupled between the second semiconductor die and the third semiconductor die, wherein the power associated with the first power domain is configured to be sent from the second semiconductor die to the third semiconductor die via the wirebond.

16. The semiconductor package of claim 15, wherein:
- each of the first electronic component and the second electronic component comprises a central processing unit (CPU); and
- the third electronic component comprises a memory.

* * * * *